United States Patent
Chantre et al.

(10) Patent No.: US 6,177,717 B1
(45) Date of Patent: Jan. 23, 2001

(54) LOW-NOISE VERTICAL BIPOLAR TRANSISTOR AND CORRESPONDING FABRICATION PROCESS

(75) Inventors: Alain Chantre, Seyssins; Michel Marty, St. Paul de Varces; Didier Dutartre, Meylan; Augustin Monroy, St. Martin d'Heres; Michel Laurens, St. Egreve; Francois Guette, Montbonnot St. Martin, all of (FR)

(73) Assignee: STMicroelectronics, S.A., Gentilly (FR)

(*) Notice: Under 35 U.S.C. 154(b), the term of this patent shall be extended for 0 days.

(21) Appl. No.: 09/323,418

(22) Filed: Jun. 1, 1999

(30) Foreign Application Priority Data

Jun. 5, 1998 (FR) .................................................... 9807059

(51) Int. Cl.[7] ...................... H01L 27/082; H01L 27/102; H01L 27/70; H01L 31/11
(52) U.S. Cl. .......................... 257/565; 257/573; 257/592; 257/616
(58) Field of Search ............................ 438/309, 341, 438/349, 350, 357, 364, 365, 366, 368, 370, 375, 489, 969; 257/307, 378, 557, 563, 565, 573, 587, 588, 591, 592

(56) References Cited

U.S. PATENT DOCUMENTS

| | | | |
|---|---|---|---|
| 5,219,767 | * 6/1993 | Kohno | 438/309 |
| 5,266,504 | 11/1993 | Blouse et al. | 438/364 |
| 5,296,391 | 3/1994 | Sato et al. | 438/341 |
| 5,432,104 | 7/1995 | Sato | 438/366 |
| 5,698,890 | * 12/1997 | Sato | 257/592 |
| 5,962,880 | * 10/1999 | Oda et al. | 257/198 |

FOREIGN PATENT DOCUMENTS 196 50 493 A1   5/1996 (DE).

* cited by examiner

Primary Examiner—Olik Chaudhuri
Assistant Examiner—Hoai Pham
(74) Attorney, Agent, or Firm—Theodore E. Galanthay; Allen, Dyer, Doppelt, Milbrath & Gilchrist, P.A.

(57) ABSTRACT

The intrinsic collector of a vertical bipolar transitor is grown epitaxially on an extrinsic collector layer buried in a semiconductor substrate. A lateral isolation region surrounds the upper part of the intrinsic collector and an offset extrinsic collector well is produced. An SiGe heterojunction base lying above the intrinsic collector and above the lateral isolation region is produced by non-selective epitaxy. An in-situ doped emitter is produced by epitaxy on a predetermined window in the surface of the base which lies above the intrinsic collector so as to obtain, at least above the window, an emitter region formed from single-crystal silicon and directly in contact with the silicon of the base.

16 Claims, 4 Drawing Sheets

LOW-NOISE VERTICAL BIPOLAR TRANSISTOR AND CORRESPONDING FABRICATION PROCESS

RELATED APPLICATIONS

This application is related to: copending application entitled "METHOD OF SELECTIVELY DOPING THE INTRINSIC COLLECTOR OF A VERTICAL BIPOLAR TRANSISTOR WITH EPITAXIAL BASE", U.S. application Ser. No. 09/323,525; and copending application entitled "VERTICAL BIPOLAR TRANSISTOR INCLUDING AN EXTRINSIC BASE WITH REDUCED ROUGHNESS, AND FABRICATION PROCESS", U.S. application Ser. No. 09/323,357, which were concurrently filed with the present application.

FIELD OF THE INVENTION

The invention relates to vertical bipolar transistors, especially those intended to be integrated in high-frequency very-large-scale-integration (VLSI) technologies. In particular, the invention relates to the characteristics and production of the emitters for these transistors.

BACKGROUND OF THE INVENTION

In polysilicon-emitter bipolar technologies, the emitter results from a deposition of polysilicon which can be carried out in a conventional oven followed by a doping operation. As a variant, the emitter may be doped in situ in a chemical vapor deposition (CVD) reactor. In both cases, an oxide layer is present at the emitter/base interface. This layer limits the hole current in the base (injected electrons continue to flow due to the tunnel effect). This helps to obtain a sufficient current gain ($I_c/I_b$).

However, these polysilicon-emitter transistors have certain drawbacks. First of all, they exhibit low-frequency noise which results in low-frequency fluctuations in the transistor current. This is even more troublesome in the case of radio frequency circuits incorporating such transistors for separating two close carriers. Furthermore, this is troublesome in the case of oscillators. Moreover, the dimensional characteristics of the oxide layer at the base/polysilicon-emitter interface have an influence on the static parameters of the transistor, especially its gain. However, it is particularly difficult to guarantee identical characteristics for oxide interfaces of all the transistors of several batches, this being especially so when the surface of the emitters varies. Consequently, it is particularly difficult to obtain uniform characteristics in all the transistors produced, whatever the surface of their emitter.

SUMMARY OF THE INVENTION

An object of the invention is to overcome these problems.

One object of the invention is to reduce the low-frequency noise while still retaining acceptable static parameters, and especially a correct current gain.

Another object of the invention is to allow better uniformity of the characteristics of the transistors to be obtained, whatever the surface of their emitter.

A further object of the invention is to provide a bipolar transistor in which the doping of the emitter allows both a high electron injection efficiency and good siliciding of the upper surface of the emitter.

The invention therefore provides a process for fabricating a vertical bipolar transistor, comprising a step of producing an intrinsic collector, for example by epitaxial growth or implantation, on an extrinsic collector layer buried in a semiconductor substrate. Furthermore, the process includes a step of producing a lateral isolation region surrounding the upper part of the intrinsic collector and of producing an offset extrinsic collector well, and a step of producing an SiGe (Silicon-Germanium) heterojunction base lying above the intrinsic collector and above the lateral isolation region. The step of producing the SiGe heterojunction base comprises the non-selective epitaxial growth of a stack of layers comprising at least one SiGe layer, for example, an SiGe layer encapsulated by two silicon layers or else an SiGe layer on top of a silicon layer, and a step of producing an in-situ doped emitter comprising epitaxial growth on a predetermined window of the surface of the stack ("emitter window"). The window lies above the intrinsic collector, so as to obtain, at least above the window, an emitter region formed from single-crystal silicon and directly in contact with the upper layer of the stack, for example, the silicon of the upper encapsulation layer of the stack.

In other words, the invention provides a way of producing an epitaxially grown single-crystal emitter directly on the "base" (in fact, the emitter/base junction defining the upper part of the intrinsic base lies in the upper encapsulation layer) so as to avoid the problem of the presence of an interfacial oxide layer. Consequently, the single-crystal emitter grown epitaxially, which means that there is no interfacial oxide, results in better uniformity of the characteristics of the transistors, whatever the surface of the emitters.

Moreover, it has been observed that such transistors with an emitter which is grown epitaxially directly on the base, and consequently which avoids the problem of interfacial oxide, exhibited appreciably reduced low-frequency noise. Furthermore, the presence of a silicon-germanium heterojunction base makes it possible, in combination with an emitter grown epitaxially directly on the base, to compensate to an acceptable extent for the loss of gain caused by the disappearance of the interfacial oxide layer.

Finally, the use of in-situ doping of the emitter, in combination with a single-crystal emitter, makes it possible, when producing the emitter, to gradually vary the amount of dopant while the emitter is being grown. This makes it possible, as will be seen in detail below in one particularly advantageous method of implementation, to obtain a higher dopant concentration in the bottom of the emitter than in the top of the emitter. This advantage is not possible with a polycrystalline emitter since the dopant is naturally distributed within the polysilicon because of the presence of the grain boundaries.

According to one method of implementing the invention, the step of producing the emitter comprises a first phase comprising the deposition of a silicon dioxide first layer on the surface of the stack, the deposition of a silicon nitride second layer on the silicon dioxide first layer, the etching of a zone corresponding to the position of the emitter window, in the silicon nitride layer, stopping the etching on the silicon dioxide first layer, then chemically deoxidizing the zone so as to obtain a silicon surface having a concentration of oxygen atoms of less than $10^{15}/cm^3$ in the window. The step of producing the emitter comprises a second phase comprising the exposure of the semiconductor block obtained at the first phase to a gas mixture of silane and of dopants in a non-oxidizing controlled atmosphere, for example, under vacuum, in an ultraclean CVD reactor well known to those skilled in the art.

Thus, the invention allows the use of conventional polysilicon deposition conditions in an ultraclean CVD reactor. However, the silicon grows in single-crystal form on the base because of the chemically clean character of the window in the base.

According to a first variant of the invention, after the second phase, a silicon layer is obtained which is of single-crystal form at least above the window and which is etched so as to form an emitter comprising an upper region wider than the window, this region bearing on part of the silicon nitride layer. Isolating spacers are then formed which are in contact with the vertical walls of the upper region wider than the emitter.

According to another variant of the invention, the first phase comprises the deposition of a thick silicon dioxide third layer on the silicon nitride second layer and preliminarily etching a region, corresponding to the position of the zone and consequently of the emitter window, in the silicon dioxide third layer, stopping on the silicon nitride second layer, so as to obtain, after the first phase, a semiconductor block comprising a cavity, of the same width as the window, in the stack of the three insulating layers. After the second phase, in other words, after epitaxial growth of the emitter, the cavity is filled by the epitaxial growth, the silicon dioxide third layer is etched on each side of the emitter block formed in the cavity and isolating spacers are formed which are in contact with the vertical walls of the emitter.

In other words, according to this variant of the invention, a shorter distance is obtained between the edge of the emitter and the implanted zone of extrinsic base, thereby helping to further reduce the base resistance as well as the base-collector capacitance. Furthermore, this shorter distance is controlled by a single photolithography level.

According to one method of implementing the invention, which may, moreover, apply to either of the variants that have just been explained, the amount of dopant gas in the second phase is varied so as to obtain a lower dopant concentration in the upper part of the emitter than in the lower part directly in contact with the base. This makes it possible to obtain both a high electron injection efficiency and good siliciding of the upper part of the emitter.

The invention is also directed to a vertical bipolar transistor comprising an intrinsic collector located on an extrinsic collector layer buried in a semiconductor substrate, a lateral isolation region surrounding the upper part of the intrinsic collector, an offset extrinsic collector well, and an SiGe heterojunction base lying above the intrinsic collector and above the lateral isolation region. The transistor is formed of a stack of layers comprising at least one SiGe layer, for example, an SiGe layer, encapsulated by two silicon layers. The transistor also comprises a doped emitter, which is surrounded by the extrinsic base, comprising, at least above a predetermined window in the surface of the stack, a window lying above the intrinsic collector, and an emitter region formed from single-crystal silicon directly in contact with the upper layer of the stack, for example, the silicon of the upper encapsulation layer of the stack. The window in the surface of the stack advantageously has a concentration of oxygen atoms of less than $10^{15}/cm^3$.

According to a first embodiment of the invention, the emitter comprises an upper region wider than the window and bearing on a silicon nitride layer which itself is supported by a silicon dioxide layer resting on part of the base. Moreover, the emitter comprises isolating spacers in contact with the vertical walls of the upper region wider than the emitter and bearing on the silicon dioxide layer.

According to another embodiment of the invention, the emitter is formed from a block of the same width as the window, which the entire block bears directly on the stack. It comprises isolating spacers in contact with the vertical walls of the emitter and bearing on a silicon dioxide layer. According to another embodiment of the invention, the emitter is doped more lightly in its upper part than in its lower part directly in contact with the base.

BRIEF DESCRIPTION OF THE DRAWINGS

Further advantages and characteristics of the invention will be apparent from reading the detailed description of methods of implementation and of embodiments, these being entirely non-limiting, and on examining the appended drawings in which.

DETAILED DESCRIPTION OF THE PREFERRED EMBODIMENTS

Figure 1:
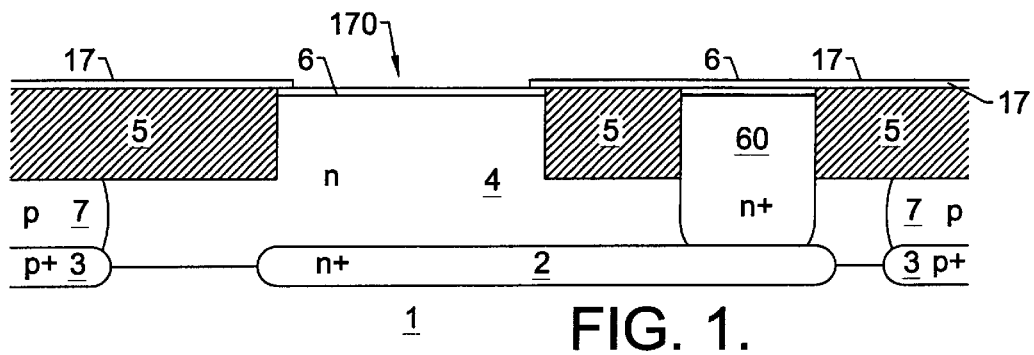
FIGS. 1 to 6 diagrammatically illustrate a first method of implementing the process according to the invention, resulting in a first embodiment of a bipolar transistor according to the invention, and FIGS. 7 to 11 diagrammatically illustrate a second method of implementing the process according to the invention, resulting in a second embodiment of a bipolar transistor according to the invention.

In FIG. 1, the reference 1 denotes a silicon substrate, for example, a p-type silicon substrate, on the surface of which a buried extrinsic collector layer 2, $n^+$ doped by arsenic implantation, is produced in a conventional manner. Likewise, two buried layers 3, $p^+$ doped by boron implantation, produced in a conventional manner are on each side of the extrinsic collector 2. A thick n-type single-crystal silicon layer 4 is grown epitaxially, in a known manner, on the substrate 1 thus formed. This layer 4 typically has a thickness of about 1 micron Next, a lateral isolating region 5 is produced in this layer 4, in a known manner, either by a local oxidation (or LOCOS) process or a shallow-trench type process. For the sake of simplification, FIG. 1 shows a lateral isolation region 5 of the shallow-trench type. An $n^+$ doped collector well 60 contacting the buried layer 2 is also conventionally produced, e.g. by phosphorous implantation. Next, boron implantation steps are carried out so as to produce p– doped wells 7 under the lateral isolation region 5, allowing the bipolar transistor described here to be isolated from the adjacent transistors.

Next, a thermal oxide 6, typically silicon dioxide, is grown, conventionally, on the surface of the epitaxially grown single-crystal intrinsic collector 4. This silicon dioxide growth takes place also over the entire wafer, and especially on the collector well 60. This oxide also forms the gate oxide for complementary isolated-gate field-effect transistors (CMOS transistors) produced in conjunction with the bipolar transistor on the same wafer (BiCMOS (Bipolar CMOS) technology). Next, an amorphous silicon layer 17 having a thickness of about 500 Å is deposited on the semiconductor block thus formed. Next, a window 170, called the "base window", is etched by plasma etching, stopping on the oxide layer 6. If lateral isolation of the shallow-trench type is used, the two parts of the etched silicon layer 17 slightly overhang above the intrinsic collector 4. If lateral isolation of the LOCOS-type is used, the etching window 170 may be wider than the intrinsic collector 4.

Figure 2:
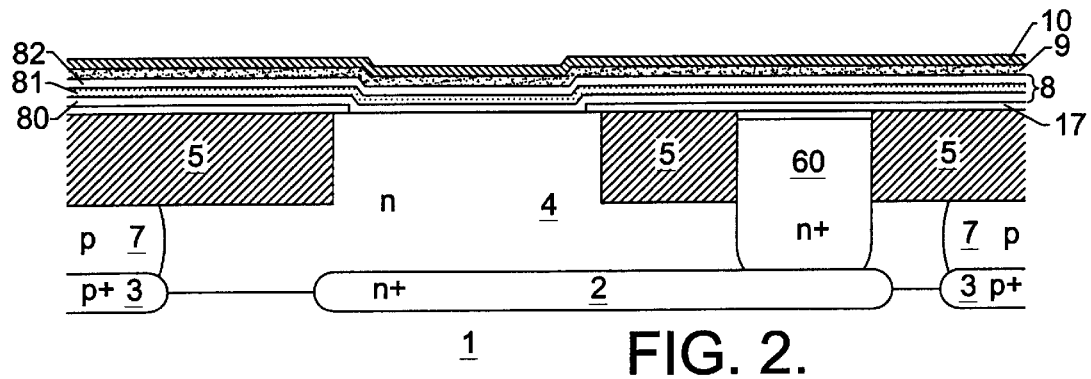

Next (FIG. 2), the oxide layer 6 lying above the collector undergoes chemical deoxidation. It should be noted here that one of the functions of the amorphous silicon layer 17 is to protect the rest of the wafer during this chemical deoxidation and especially the lateral isolation zones when these are produced by shallow trenches.

Next, after the base window has undergone a desorption treatment in hydrogen at a temperature above 600° C., a stack 8 of three layers 80,81 and 82, within which the future base of the transistor will be produced, is grown epitaxially. More specifically, an undoped silicon first layer 80 is grown epitaxially to a depth of a few tens of nanometers. Next, the second layer 81, formed from silicon-germanium, is grown epitaxially. This layer is composed of a first sublayer of $Si_{1-x}Ge_x$, here x is constant and lies between 0.1 and 0.2, on top of which is a second sublayer also formed from an $Si_{1-x}Ge_x$ alloy (where x, for example, decreases to 0) and p-doped by boron. The total thickness of the layer 81 may typically be from 20 to 100 nm.

Next, the second sublayer of the layer 81 is covered by an epitaxially grown layer 82 of silicon p-doped by boron. This layer 82 has a thickness of a few tens of nanometers. After this epitaxy, typically carried out at 700° C. in an ultraclean CVD reactor, a stack of layers is therefore obtained. These layers are single-crystal layers on the intrinsic collector in the base window and polycrystalline layers above the amorphous silicon layers 17. This multilayer stack will allow a silicon-germanium heterojunction base to be formed. It should be noted here that the epitaxy for producing the heterojunction base is non-selective epitaxy.

Moreover, the presence of the amorphous silicon layer 17 makes it possible to have, at the start of epitaxy, a surface essentially formed from silicon. This makes it possible to obtain a growth rate which is approximately the same on the intrinsic collector and on the amorphous silicon, resulting in greater thickness uniformity of the base. Next, a silicon dioxide first layer 9 having a thickness of about 200 Å is deposited on the layer 81. Also deposited on the silicon dioxide first layer 9 is a silicon nitride ($Si_3N_4$) second layer 10 having a thickness of 300 Å.

Figure 3:
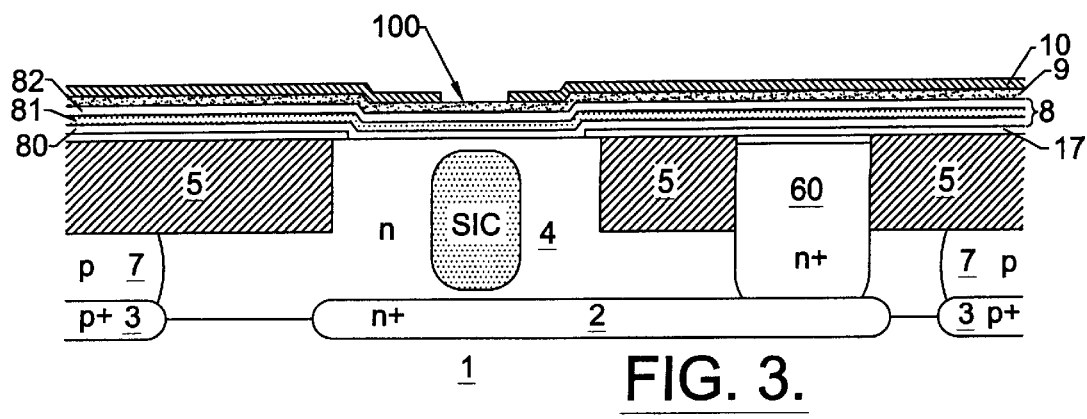

Next (FIG. 3), a zone 100 is defined, using a mask, in the nitride layer 10 corresponding to an emitter window lying above the intrinsic collector 4. Then, using a resin layer corresponding to the mask, the nitride layer 10 is conventionally plasma-etched, stopping on the silicon dioxide layer 9, so as to expose the zone 100. Next, the operation of implanting phosphorous through the base is carried out, while retaining the resin which is present on the layer 10 and has served for etching such layer 10. An operation of selectively overdoping the collector (to form a selective implantation collector) below the emitter window may be carried out in one or more implantation steps. This helps to increase the speed of the transistor by reducing the collector resistance. An overdoped SIC zone below the emitter window is therefore obtained.

Figure 4:
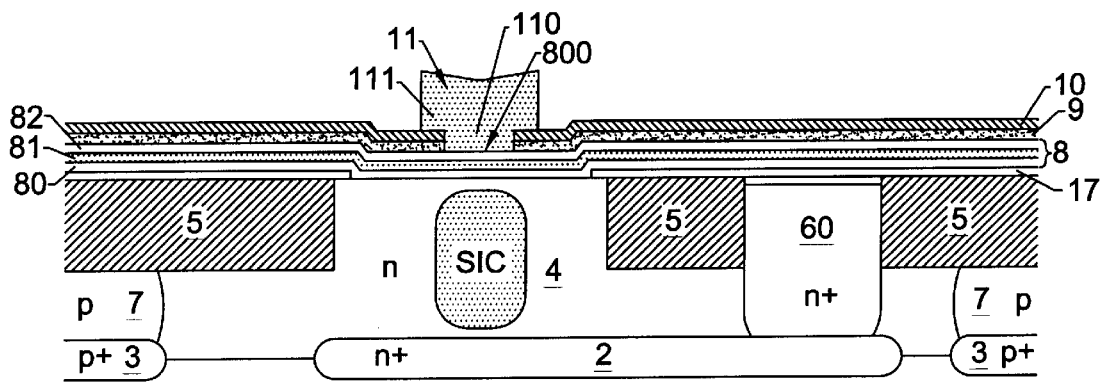

After this step, the resin present on the silicon nitride layer 10 is removed and a chemical deoxidation treatment is carried out so as to remove the part of the silicon dioxide layer 9 which lies in the zone 100 and thus to produce the emitter window 800 (FIG. 4). An example of such a chemical deoxidation treatment includes using an acid bath based on an approximately 1% dilute hydrofluoric acid for 1 minute. This makes it possible to obtain a chemically clean single-crystal silicon surface, i.e. a surface whose concentration of oxygen atoms is less than $10^{15}/cm^3$. Moreover, such a chemical deoxidation step does not degrade the underlying single-crystal silicon surface (unlike plasma etching, for example) and consequently does not introduce crystal defects. In order to further improve the surface state of the silicon, it is advantageous to carry out a high-temperature (>550° C.) desorption treatment in hydrogen so as to remove residual impurities adsorbed on the surface of the silicon during the deoxidation.

Next, the emitter of the transistor is produced in an ultraclean CVD reactor, for example, the reactor sold by the company Applied Materials under the reference Centura HTF. More specifically, the semiconductor block with the exposed base at the emitter window 800 is exposed to a silane/arsine gas mixture in a non-oxidizing atmosphere, typically a vacuum, or in hydrogen. The CVD conditions are, for example, a hydrogen flow rate of 10 liters/minute, a silane flow rate of 0.5 liters/minute and an arsine flow rate of 0.12 $cm^3$/minute at 630° C. and at a pressure of 80 torr. Those skilled in the art will have noted that these conditions correspond to polysilicon deposition. However, because of the chemically clean character of the single-crystal surface of the exposed base at the window 800, the silicon deposited in this reactor grows epitaxially, i.e. it forms a single-crystal layer on the base.

After having obtained a silicon layer with a thickness of about 2500 Å, the silicon layer is conventionally etched, using a new photolithography mask and a corresponding resin block, so as to obtain (FIG. 4) an emitter 11 having, in the window 800, a lower part 110 on which there is an upper part 111 wider than the emitter window. The distance between the edge of the emitter window and the edge of the region 111 is typically about 0.2 μm. This emitter was therefore doped in situ and is of single-crystal form at least near the interface with the base in the emitter window. In practice, it was observed that it was of single-crystal form near the interface and polycrystalline above the nitride, and had a preferred orientation in the upper epitaxially grown part, above the window.

Figure 5:
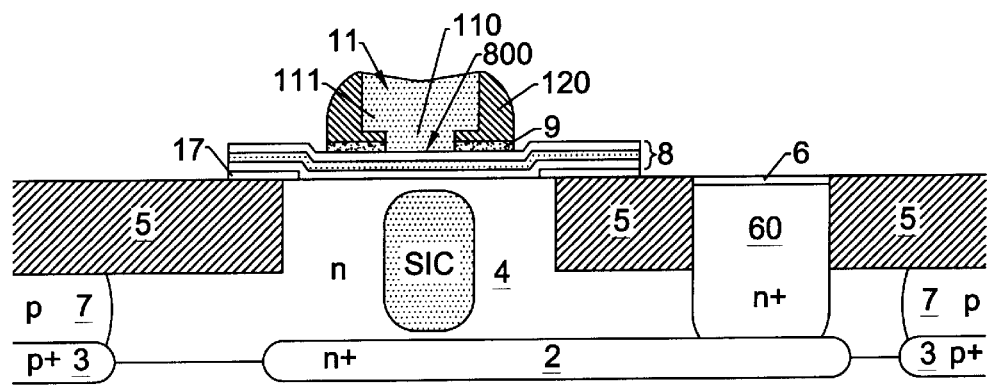

Next, a silicon nitride layer is deposited and etched so as to obtain spacers 120 which include the silicon nitride layer 10 and bear on the vertical walls of the upper region 111 of the emitter and on the silicon dioxide layer 9 (FIG. 5). Next, the geometry of the base of the transistor is then defined, using a new mask, and then, after the oxide layer 9 has been pre-etched, the stack of the layers 17 and 8 is etched so as to obtain the configuration illustrated in FIG. 5.

Figure 6:
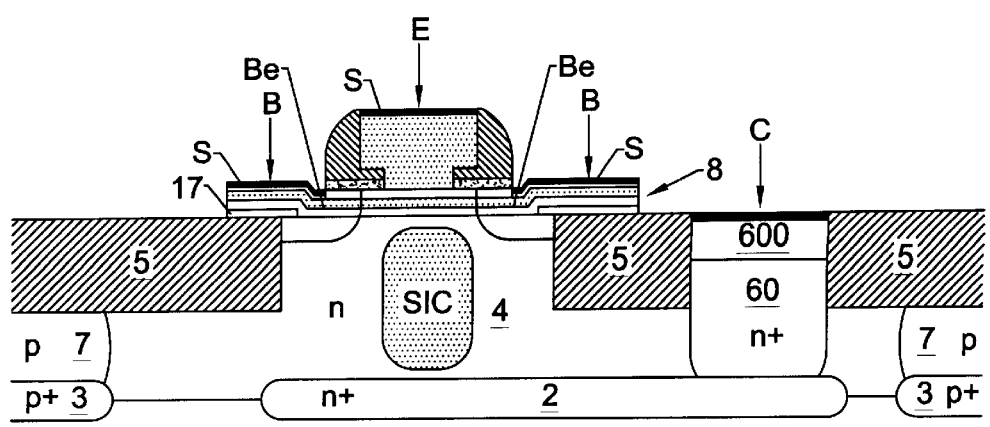

Next, deposited on each side of the base, is a block of resin, as well as an amount of resin above the emitter. Then the stack 8 undergoes p+ implantations using boron so as to define the extrinsic base Be (FIG. 6). Next, after the transistor has been protected by resin, an arsenic implantation operation is carried out so as to produce an n+ implanted zone, labeled 600, on the surface of the collector well. The final step includes producing the base, emitter and collector connection pads S using a known technique of the "self-aligned suicide" type, which comprises depositing a layer of metal, (for example titanium) in order to form a silicide ($TiSi_2$) on the silicon areas of the extrinsic base, the emitter and the extrinsic collector.

The transistor according to the invention, as illustrated in FIG. 6 is therefore an n-p-n vertical bipolar transistor with a silicon-germanium heterojunction base which can be used in VLSI-type BiCMOS technology. It has a single-crystal emitter directly in contact with the silicon of the upper encapsulation layer 82. However, because of the dopant diffusions and the various conventional heat treatments, the emitter/base junction lies within the layer 82. The low-frequency noise of the transistor is reduced, while its static parameters, especially the current gain, remain good. Furthermore, the transistor has a lower emitter resistance compared with transistors which have a polycrystalline emitter.

In the embodiment which has just been described, the distance between the edge of the window 800 and the edge of the upper region of the emitter depends on the alignment of the photolithography mask used for etching the upper region of the emitter with respect to the photolithography mask used for etching the emitter window proper. This makes the fabrication of the transistor slightly more difficult.

Figure 7:
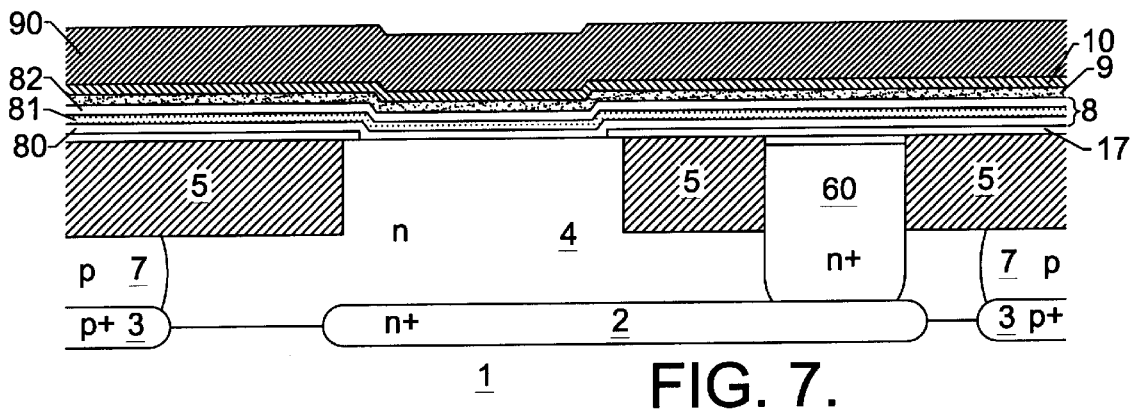
Figure 8:
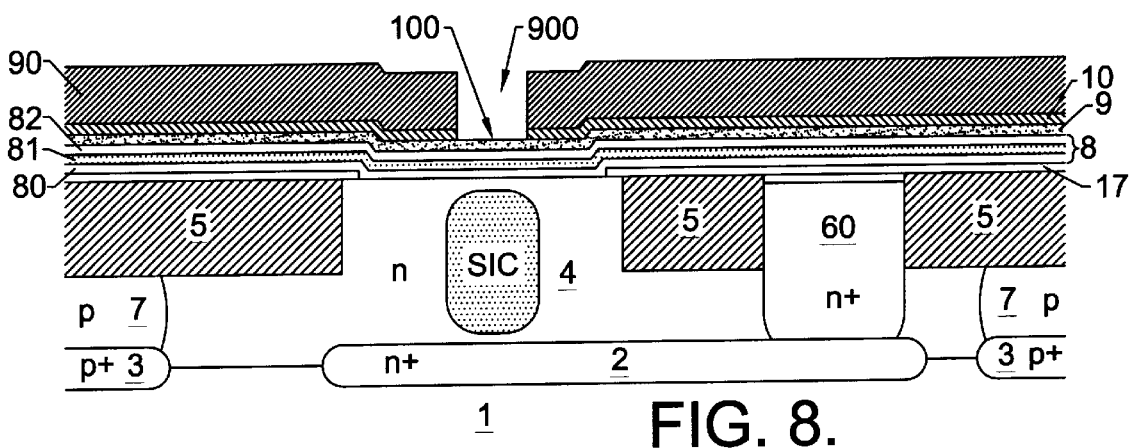
Figure 9:
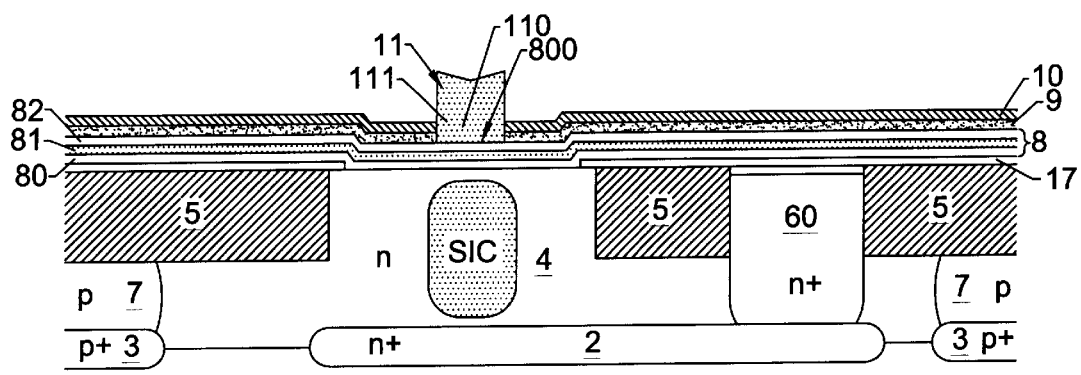
Figure 10:
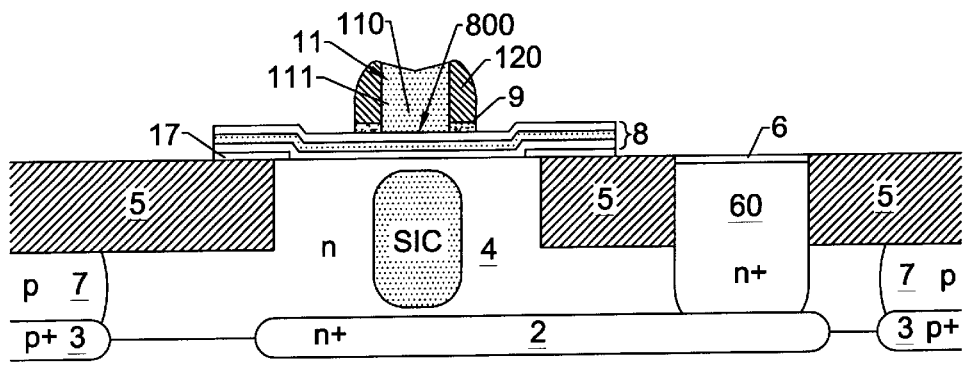
Figure 11:
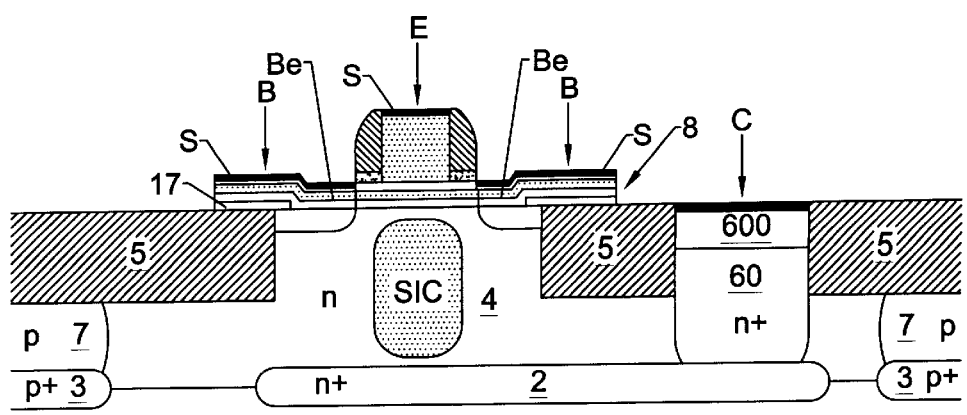

The embodiment illustrated in FIGS. 7 to 11 makes it possible to avoid this problem since, as illustrated in FIG. 7, a thick silicon dioxide third layer 90 (typically having a thickness of 2000 Å) is deposited on the silicon nitride layer 10. Next (FIG. 8), a region 900 corresponding to the position of the zone 100 of the layer 10 (FIG. 3), and consequently the position of the emitter window 800, is conventionally plasma-etched in the thick layer 90, stopping on the silicon nitride second layer 10. The etching of the emitter window continues in a similar way to that described in the previous method of implementation. Likewise, the implantation of the SIC zone is similar to that described above.

Next, silicon is deposited, in a similar way to that described above, under polysilicon deposition conditions causing re-epitaxial growth of the silicon on the base in the cavity made within the stack of successive layers of silicon dioxide 9, silicon nitride 10 and silicon dioxide 90. Next, the silicon extending beyond the cavity is removed, for example by mechanical-chemical polishing, or else by full-wafer etching, stopping on the oxide layer 90. Then (FIG. 9), the layer 90 is plasma-etched on each side of the epitaxially grown single-crystal silicon, stopping on the silicon nitride layer 10, so as to obtain an emitter formed as a single block 110 with the same width as the emitter window. The next steps of this method of implementation, and especially the formation of the spacers 120, are similar to those described above.

Consequently, a short distance is obtained between the edge of the emitter and the edge of the spacers 120, this distance no longer being controlled by a photolithography operation. Apart from the technological simplification, a lower base resistance and a lower base-collector capacitance are obtained in the case of the transistor illustrated in FIG. 11. Finally, in either of the two embodiments which have just been described, it is particularly advantageous when producing the in-situ doped emitter to gradually vary the amount of dopant gas while the emitter is being epitaxially grown. Thus, at the start of the epitaxy, the abovementioned arsine flow rate (0.12 $cm^3$/minute) will, for example, be maintained while, in the upper region of the emitter, this flow rate will be reduced until it reaches, for example, the value of 0.6 $cm^3$/minute. Finally, in the case of the in-situ doped emitter, an As dopant concentration of, for example, $3 \times 10^{20}/cm^3$ in the lower region of the emitter in contact with the base and an As dopant concentration of, for example, $10^{20}/cm^3$ in the upper region of the emitter will therefore be obtained. These values therefore make it possible to achieve both good electron injection in the lower part of the emitter and good siliciding above the upper part of the emitter.

That which is claimed is:

1. A vertical bipolar transistor comprising:

a semiconductor substrate;

an extrinsic collector layer buried in the semiconductor substrate;

an intrinsic collector on the extrinsic collector layer, the intrinsic collector having an upper part;

a lateral isolation region surrounding the upper part of the intrinsic collector;

an extrinsic collector well on the semiconductor substrate;

an SiGe heterojunction base comprising an epitaxial stack of layers above the intrinsic collector and above the lateral isolation region, the stack of layers including at least one SiGe layer;

a silicon dioxide layer on the surface of the stack and a silicon nitride layer on the silicon dioxide layer together defining a window on the surface of the stack of layers, above the intrinsic collector; and a doped emitter comprising an epitaxial single-crystal silicon layer on the window in the surface of the stack.

2. A vertical bipolar transistor according to claim 1, wherein the surface of the stack in the window has a concentration of oxygen atoms of less than about $10^{15}$ per $cm^3$.

3. A vertical bipolar transistor according to claim 1, wherein the emitter includes an upper region wider than the window, the upper region having side walls above and bearing on part of the silicon nitride layer.

4. A vertical bipolar transistor according to claim 3, further comprising isolating spacers in contact with the side walls of the upper region of the emitter.

5. A vertical bipolar transistor according to claim 3, wherein the upper region of the emitter has a lower dopant concentration than a lower region of the emitter.

6. A vertical bipolar transistor according to claim 1, wherein the emitter includes side walls, an upper region and a lower region, the lower region being in contact with the stack of layers.

7. A vertical bipolar transistor according to claim 6, further comprising isolating spacers in contact with the side walls of the emitter.

8. A vertical bipolar transistor according to claim 6, wherein the upper region of the emitter has a lower dopant concentration than the lower region of the emitter.

9. A vertical bipolar transistor comprising:
- a semiconductor substrate;
- an extrinsic collector layer buried in the semiconductor substrate;
- an intrinsic collector on the extrinsic collector layer, the intrinsic collector having an upper part;
- a lateral isolation region surrounding the upper part of the intrinsic collector;
- an extrinsic collector well on the semiconductor substrate;
- a base comprising an epitaxial stack of layers above the intrinsic collector and above the lateral isolation region;
- a silicon dioxide layer on the surface of the stack and a silicon nitride layer on the silicon dioxide layer together defining a window on the surface of the stack of layers, above the intrinsic collector; and
- a doped emitter comprising an epitaxial single-crystal silicon layer on the window in the surface of the stack.

10. A vertical bipolar transistor according to claim 9, wherein the surface of the stack in the window has a concentration of oxygen atoms of less than about $10^{15}$ per $cm^3$.

11. A vertical bipolar transistor according to claim 9, wherein the emitter includes an upper region wider than the window, the upper region having side walls above and bearing on part of the silicon nitride layer.

12. A vertical bipolar transistor according to claim 11, further comprising isolating spacers in contact with the side walls of the upper region of the emitter.

13. A vertical bipolar transistor according to claim 11, wherein the upper region of the emitter has a lower dopant concentration than a lower region of the emitter.

14. A vertical bipolar transistor according to claim 9, wherein the emitter includes side walls, an upper region and a lower region, the lower region being in contact with the stack of layers.

15. A vertical bipolar transistor according to claim 14, further comprising isolating spacers in contact with the side walls of the emitter.

16. A vertical bipolar transistor according to claim 14, wherein the upper region of the emitter has a lower dopant concentration than the lower region of the emitter.

* * * * *

UNITED STATES PATENT AND TRADEMARK OFFICE
CERTIFICATE OF CORRECTION

PATENT NO. : 6,177,717 B1
DATED : January 23, 2001
INVENTOR(S) : Chantre et al.

Page 1 of 1

It is certified that error appears in the above-identified patent and that said Letters Patent is hereby corrected as shown below:

After [73] Assignee: STMicroelectronics, S.A., Gentilly (FR),
Insert: --; Commissariat à l'Energie Atomique; Paris, France --.

Signed and Sealed this

Seventeenth Day of July, 2001

*Attest:*

*Nicholas P. Godici*

*Attesting Officer*

NICHOLAS P. GODICI
*Acting Director of the United States Patent and Trademark Office*